United States Patent [19]

Raposa

[11] Patent Number: 5,448,441
[45] Date of Patent: Sep. 5, 1995

[54] FAULT PROTECTION CIRCUIT FOR POWER SWITCHING DEVICE

[75] Inventor: John R. Raposa, Warren, R.I.

[73] Assignee: The United States of America as represented by the Secretary of the Navy, Washington, D.C.

[21] Appl. No.: 223,346

[22] Filed: Apr. 5, 1994

[51] Int. Cl.⁶ .............................................. H02H 9/04
[52] U.S. Cl. ........................................ 361/18; 361/89; 361/90; 361/91
[58] Field of Search .................... 361/18, 28, 30, 91, 361/88, 90, 93, 89

[56] References Cited

U.S. PATENT DOCUMENTS

| | | | |
|---|---|---|---|
| 4,658,203 | 4/1987 | Freymuth | 361/91 |
| 4,665,459 | 5/1987 | Bynum et al. | 361/91 |
| 4,893,212 | 1/1990 | Wong et al. | 361/91 |

*Primary Examiner*—Marc S. Hoff
*Assistant Examiner*—S. Jackson
*Attorney, Agent, or Firm*—Michael J. McGowan; James M. Kasischke; Prithvi C. Lall

[57] ABSTRACT

A fault protection circuit for a power switching device. The circuit comprises a driver circuit electrically connected to the power switching device, a saturation comparator electrically connected to the collector of the switching device to determine if the switching device is switching an excessive voltage, and two undervoltage comparators to determine if the gate is receiving sufficient voltage. If the gate is oversaturated the saturation comparator enables the gate of a field effect transistor which drains the gate of the switching device, and the saturation comparator also disables the driver circuit. The undervoltage detectors detect insufficient voltage to the driver circuit and disable the driver circuit. Once the driver circuit is disabled the control circuitry can take corrective action.

19 Claims, 3 Drawing Sheets

FAULT PROTECTION CIRCUIT FOR POWER SWITCHING DEVICE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

The present invention relates to fault protection circuitry for providing protection to a power switching device and more particularly to a high speed means for protecting the power switching device against faults caused by short circuits, oversaturation, shoot through, and undervoltage.

(2) Description of the Prior Art

Alternating current electric motor systems often depend on batteries as a power source, and, thus, the design of high power, power dense, reliable inverter electronics is critical in converting direct current from batteries to alternating current for supply to the electric motor. The development of high power, metal oxide semiconductor (MOS) controlled switching devices such as an insulated gate bipolar transistor (IGBT) has enabled the use of semiconductor devices in power control circuitry. However, MOS controlled switching devices are sensitive to varying voltages and must be protected from voltage spikes and voltage underflow. Excess current through the MOS switching device causes high temperatures in the device which eventually will lead to its destruction. Operation of the MOS switching device at low gate drive voltage causes the gate to drop out of saturation. When the device is out of saturation, heating occurs in the device because of increased resistivity resulting in damage to the device.

As a general rule, once any of the above failure modes appears, the MOS controlled switching device should be turned off within 10 $\mu$sec. If this time limit is exceeded the switching device can be destroyed or severely weakened. Furthermore, the MOS switching device must be shut down properly to avoid placing the device in a failure mode. For example, trying to shut down the device while it is switching full power can cause destructive current and voltage spikes.

Various prior art circuits exist for detecting voltage spikes and underflow and providing an alternate path for excess power. To detect voltage spikes and underflows, it is well known to provide a reference voltage which can be compared with the voltage across the collector and emitter of the MOS device to activate a switch shutting down power to the MOS device.

Other prior art devices such as U.S. Pat. No. 4,893,212 provide an alternate path by connecting the collector of a bipolar transistor to the lower voltage switch terminal of a MOS device, the base of the transistor is connected to the higher voltage switch terminal of the MOS device, and the emitter of the transistor is connected to a reference voltage. The bipolar transistor allows current to flow around the MOS device when an excess voltage exists on the base. The '212 patent also includes the use of a Zener diode and resistor in parallel with the gate terminal and lower switch terminal of the MOS device. When the gate terminal is subjected to a preset excess voltage, the Zener diode allows flow of reverse current through the diode to prevent gate oxide breakdown of the MOS device.

Prior art gate control circuits have the capability of sensing that a switching device is entering a failure mode, but these gate drive circuits are not quick enough to shut down the gate before the switching device is destroyed. Furthermore, many prior art fault protection circuits are placed in the flow of switched current making them susceptible to the same failure modes as the switching device, and thus, the same voltage surge that results in destruction of the MOS device will also destroy the fault protection device. Previous gate drive designs also shut down a switching device suddenly without providing protection against transients inherent in device shut down.

SUMMARY OF THE INVENTION

Accordingly, it is a general purpose and object of the present invention to provide a device for preventing damage to a MOS switching device.

It is a further object that such device and method shut down the MOS switching device within 10 $\mu$sec of detection of a fault mode.

Another object is that such device and method provide for safely shutting down the MOS switching device without allowing transient currents to damage the device during shut down.

These objects are accomplished with the present invention by providing a fault protection circuit for a power switching device. The circuit comprises a driver circuit electrically connected to the power switching device, a saturation comparator electrically connected to the collector of the switching device to determine if the switching device is switching an excessive voltage, and two voltage comparators to determine if the gate is receiving sufficient voltage. If the gate is oversaturated, the saturation comparator enables the gate of a field effect transistor which drains the gate of the switching device to a predetermined voltage level, and the saturation comparator also disables the driver circuit. The voltage comparators detect insufficient voltage to the driver circuit and disable the driver circuit. Once the driver circuit is disabled the control circuitry can take corrective action.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings wherein.

DESCRIPTION OF THE PREFERRED EMBODIMENT

Figure 1:
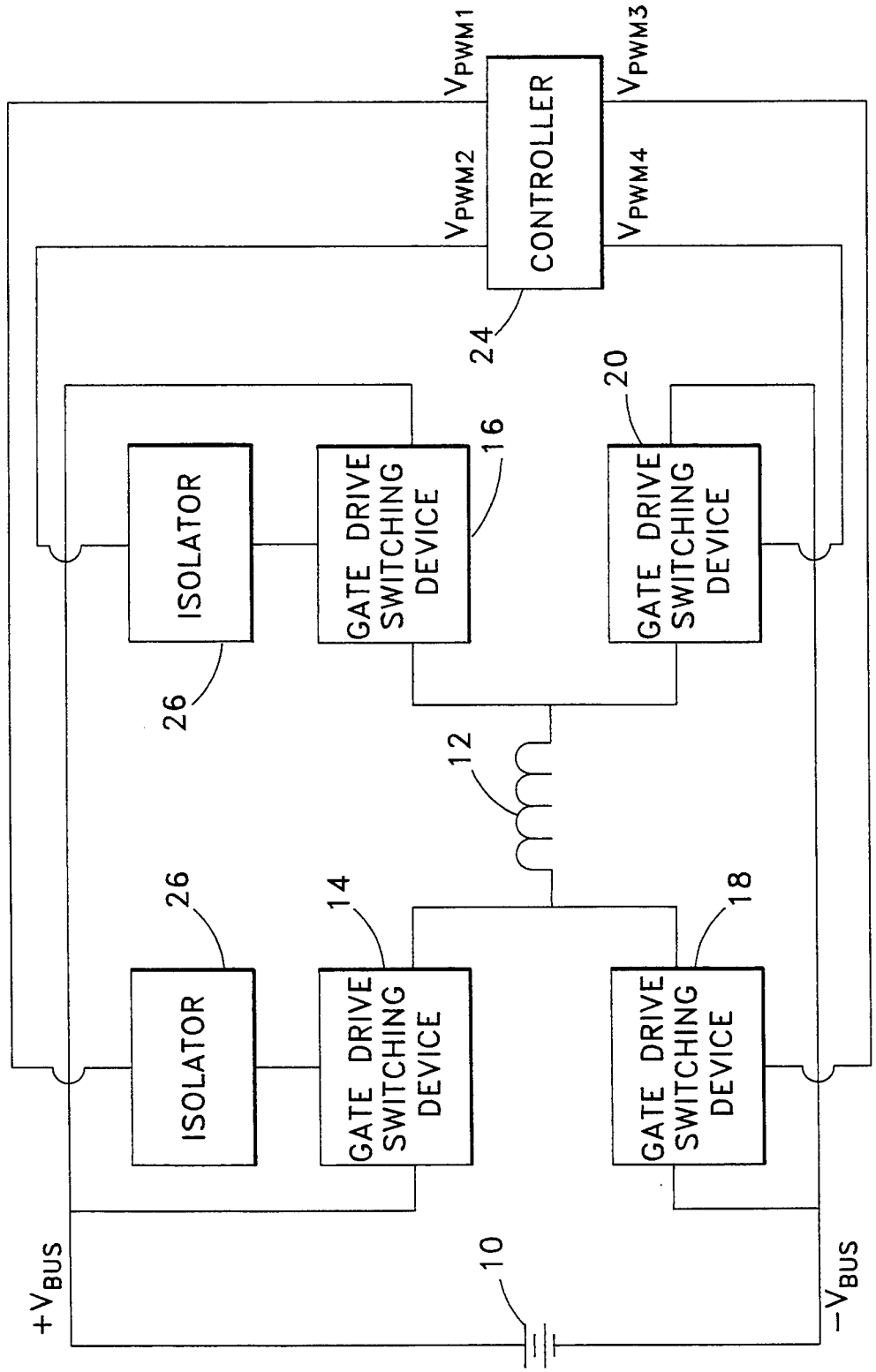
FIG. 1 is a schematic diagram displaying one coil of an electric motor coupled to a control circuit and a plurality of gate drive circuits embodying the current invention.

The gate drive circuits of the current invention are currently being used to drive switching devices that control current flow through one coil of an electric motor; however, other uses can be made of the present invention. In FIG. 1 there is shown a schematic of the inventive device as used to protect a switching device in an electric motor. FIG. 1 shows a power supply 10 joined to an electric motor coil 12 through a plurality of gate drive switching circuits 14, 16, 18, and 20. Coil 12 represents one phase of a Δ-type electric motor; however, this device can also be used in Y-type electric motors. Ground voltage for each gate drive switching circuit 14, 16, 18, and 20 is the drive circuit's lower switched voltage. Gate drive switching circuits 18 and 20 can be joined directly to a controller 24 because these switching devices operate on the low voltage side of coil 12. However, gate drive switching circuits 14 and 16 must be provided with isolators 26 to allow transmission of a control signal while electrically isolating gate drive switching circuits 14 and 16 from controller 24 because of the difference in operating voltages. Isolators 26 are typically optocouplers such as a Hewlett-Packard HCPL-2531 or the like, but other isolating circuits can be used.

To operate a motor, coil 12 must generate a magnetic field in a first direction and then in a second direction. This requires activation of coil 12 by passing a current through coil 12 in one direction and then in another. For providing current in a first direction, switching device 14 and switching device 20 must be closed to allow a conducting path between $+V_{BUS}$ and $-V_{BUS}$. Switching devices 16 and 18 must be open to avoid current leakage and short circuiting. Switching devices 16 and 18 can then be closed, and switching devices 14 and 20 opened to provide current flow in a second direction. An error known as shoot through occurs if an unloaded conducting path is present between $+V_{BUS}$ and $-V_{BUS}$. This error can occur if both switching device 14 and switching device 18 or if both switching device 16 and switching device 20 are closed at the same time.

In this embodiment, switching devices 14, 16, 18, and 20 are controlled by a pulse width modulated signal voltage, identified respectively as $V_{PWM1}$, $V_{PWM2}$, $V_{PWM3}$, and $V_{PWM4}$, passing from controller 24 to the gate drive switching circuit 14, 16, 18, or 20. The controller activates each switching device by providing a high voltage signal to the associated gate drive switching circuit 14, 16, 18, or 20. The length of time each switching device remains activated is controlled by the length of the high voltage signal. During the ordinary course of operation, switching circuits 14, 16, 18, and 20 are turned on and off numerous times.

Figure 2:
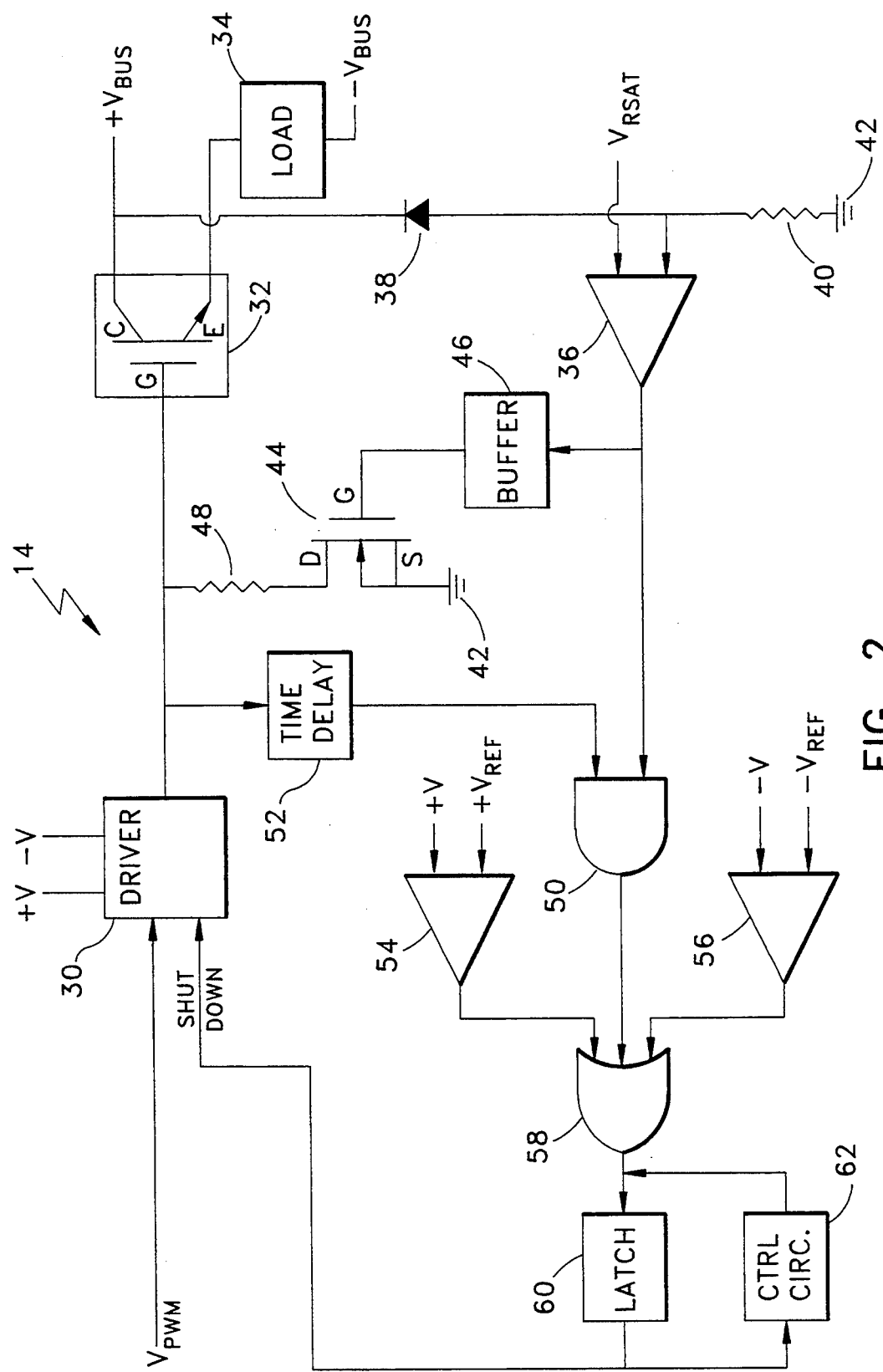
FIG. 2 shows a functional block diagram of the current invention.

Referring now to FIG. 2 there is shown a block diagram of the fault protection circuit of the current invention embodied in a gate drive switching circuit 14. The circuit in FIG. 2 is identified as 14 but can be either of the gate drive switching circuits identified in FIG. 1 as 14 or 16. With minor changes the circuit shown in FIG. 2 could also be the gate drive switching circuits indicated in FIG. 1 as 18 or 20.

A logic signal, denoted here by $V_{PWM}$, is provided to fault protection gate drive switching circuit 14 of the current invention thereby allowing current flow. For this purpose logic signal $V_{PWM}$ is transmitted to a driver circuit 30. Driver circuit 30 is electrically powered by a source voltage, $+V$, and a ground voltage, $-V$. Driver circuit 30 can be any driver circuit such as a Unitrode UC1705 or the like that is able to receive a logic signal and transform the logic signal into an output signal capable of driving a switching device. Driver circuit 30 should also have a shut down or disable port to allow a logic signal to cause reduction or elimination of the driving voltage. A switching device 32 is provided with its gate (G) electrically connected to driver circuit 30. Switching device 32 can be any switching device such as, but not limited to, a MOS field effect transistor or a MOS insulated gate bipolar transistor. A supply voltage denoted here by $+V_{BUS}$ is provided at the collector (C) of switching device 32. Emitter (E) of switching device 32 is connected to an output device here denoted by load 34 which is in turn connected to provide an output voltage denoted here by $-V_{BUS}$. Load 34 can represent coil 12 of FIG. 1 and other devices such as switching device 20 or 18 of FIG. 1; however, gate drive switching circuit 14 can also be used in other configurations as well.

When switching device 32 is closed, a large current is travelling from $+V_{BUS}$, through switching device 32 to load 34 and $-V_{BUS}$. In this embodiment, the voltage difference between $+V_{BUS}$ and $-V_{BUS}$ is on the order of 400 V. The largest voltage drop occurs at load 34. Switching device 32 only causes a three to four volt drop. A saturation comparator 36 is electrically connected to a diode 38 which is in turn electrically connected to the collector of switching device 32. Diode 38 is biased against current flow from $+V_{BUS}$ to comparator 36. Saturation comparator 36 is further connected to a grounding resistor 40 that is connected in turn to a ground 42. Ground 42 is electrically positioned at the same voltage level as the emitter of switching device 32. A small amount of current is allowed to flow from collector through diode 38 and grounding resistor 40 to ground 42.

While switching device 32 is closed, saturation comparator 36 compares the voltage at the collector of switching device 32 against a preselected saturation reference voltage denoted herein by $V_{RSAT}$. When switching device 32 is open, the path from the collector, through diode 38, and resistor 40 to ground 42 provides the path of least resistance for the large current flow from $+V_{BUS}$; however, diode 38 prevents flow of a large current through this path. In addition to preventing large current flow, diode 38 must have a reverse recovery speed of around 75 nanoseconds to prevent comparator 36 from experiencing a voltage spike on opening of switching device 32 gate.

If the voltage drop across switching device 32 gate is a preselected amount greater than $V_{RSAT}$ then comparator 36 outputs a positive signal indicating that the collector (C) of switching device 32 is oversaturated. Comparator 36 output is connected to the gate (G) of a field effect transistor 44 through a buffer 46. Buffer 46 is provided to prevent fault signal propagation time delays caused by the effects of the inherent capacitance of gate (G) of field effect transistor 44. Source (S) of field effect transistor 44 is electrically connected to ground 42. Drain (D) of field effect transistor 44 is electrically connected to a drain resistor 48 which is in turn connected to draw voltage from the connection between driver circuit 30 and gate (G) of switching device 32 thereby reducing the transmission of power through switching device 32 when comparator 36 indicates oversaturation.

An AND gate 50 is also connected to the output of saturation comparator 36. The other input of AND gate 50 is connected to the output of a time delay 52. Time delay 52 is connected with its input joined to the electrical connection between driver 30 and switching device 32 gate. Time delay 52 prevents propagation of spurious fault signals during switching device 32 activation by delaying the transmission of driver circuit 30 high signal to AND gate 50. This time delay allows saturation of switching device 32 gate before a false fault signal is created. The length of power up time delay is dependent on the size and type of switching device 32 in order to give switching device 32 time to saturate. To allow a quick turn off, time delay 52 does not cause a delay in transmission from time delay 52 input to AND gate 50 when driver 30 output is changing from a high voltage to a low voltage. AND gate 50 output is positive when driver 30 is activated and comparator 36 indicates an oversaturation fault. A first undervoltage comparator 54 is electrically connected to compare +V against a preset reference voltage, $+V_{REF}$. Likewise, a second undervoltage comparator 56 is provided to compare −V against a preset negative reference voltage, $-V_{REF}$. If AND gate 50 output, first undervoltage comparator 54 output, or second undervoltage comparator 56 output indicate a fault then an OR gate 58 provides a positive signal to a latch 60. Latch 60 is electrically connected to draw voltage away from the input port of driver circuit 30. Latch 60 provides a constant disabling signal to driver circuit 30 until latch 60 is reset. Latch 60 is also connected to control circuitry 62 to allow the system to respond to failure by resetting latch 60.

Circuit 14 shuts down switching device 32 if any of three conditions are met. If an excess voltage exists between collector (C) of switching device 32 and ground, saturation comparator 36 senses the excess voltage and immediately responds by signalling field effect transistor 44 to drain voltage from the gate (G) of switching device 32. A logical "and" function is executed between the signal from comparator 36 and driver circuit output by AND gate 50 to allow transmission of a fault signal only if switching device 32 is activated by driver circuit 30.

First undervoltage comparator 54 issues a fault signal if driving voltage, +V, is insufficient when compared with a preset reference voltage, $+V_{REF}$. Likewise, if ground voltage, −V, is a preselected amount above $-V_{REF}$ then second undervoltage comparator 56 issues a fault signal. Both of these fault signals serve to indicate that gate (G) of switching device 32 is undersaturated thereby causing excessive resistive heating.

Fault signals from AND gate 50, undervoltage comparator 54, and undervoltage comparator 56 are combined using OR gate 58 by executing a logical OR among the three signals. A combined fault signal is provided to latch 60. Latch 60 maintains the fault signal at the shut down port of driver circuit 30 until latch 60 is reset. Control circuitry 62 can be provided with additional logic to determine if circuit 14 should remain off line, be reactivated at reduced power levels, or be reactivated until a predetermined number of faults have occurred.

Figure 3:
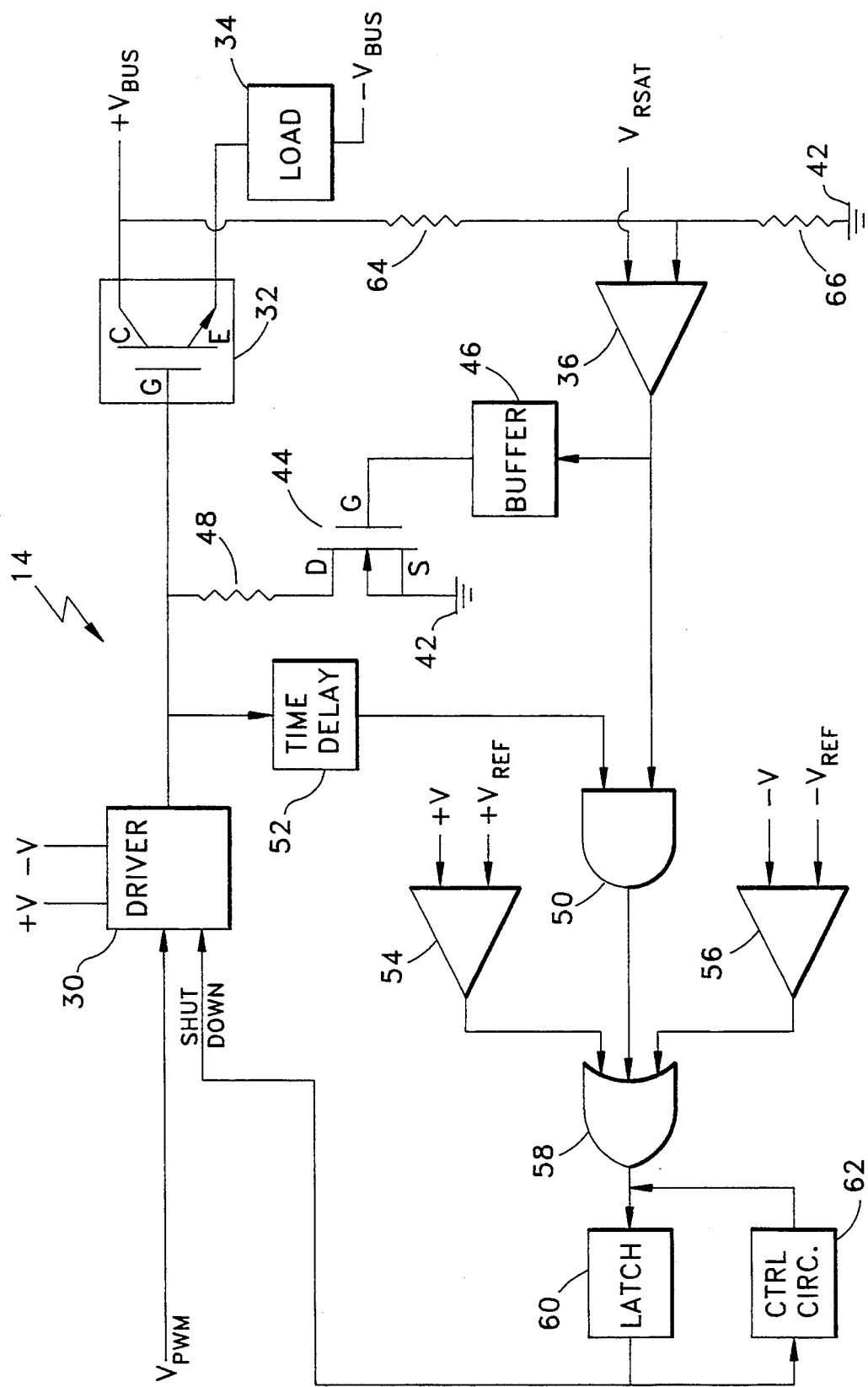
FIG. 3 shows a functional block diagram of a second embodiment of the current invention.

A second embodiment of this invention having different operating characteristics is provided in FIG. 3. The operating characteristics of this embodiment are beneficial for detecting short circuits or shoot through because this embodiment allows detection of a voltage by the saturation comparator 36 when switching device 32 is open.

The alternate embodiment of inventive device shown in FIG. 3 has a voltage divider resistor 64 in place of a diode (shown as 38 in FIG. 2) between saturation comparator 36 and switching device 32. Resistor 40 of FIG. 2 is replaced by a resistor 66 having a different resistance. The resistances of divider resistors 64 and 66 are selected in accordance with bus voltage, $+V_{BUS}$, and the desired saturation trip voltage, $V_{RSAT}$. In this embodiment only safe signal levels are provided to saturation comparator 36 because divider resistor 64 reduces the $+V_{BUS}$ voltage. A side effect of this embodiment is that relatively low voltages are masked by the divider resistors 64 and 66. This prevents this embodiment from measuring the actual saturation voltage of switching device 32 because $+V_{BUS}$ is only large enough to activate saturation comparator 36 when switching device 32 gate is open. When switching device 32 gate is closed, the measured voltage at switching device 32 is considerably below the threshold voltage required to activate saturation comparator 36.

In the first embodiment, the use of diode 38 shifts the threshold voltage range to the range around the gate saturation voltage by eliminating all voltage when switching device 32 is open thereby allowing comparator 36 greater sensitivity to voltage change. Diode 38 must be extremely fast to avoid damage to saturation comparator 36 when switching device 32 is turned off in the course of ordinary operation. In the second embodiment, the voltage divider arrangement of resistors 64 and 66 compresses a typical 400 V range causing small voltage changes to be undetectable by saturation comparator 36. As a result of this, saturation comparator 36 can only detect fault conditions such as shoot through or short circuits because oversaturation voltage is small in comparison to the voltage measured when switching device 32 is open.

The advantages of the present invention over the prior art are that this gate drive circuit design is capable of shutting a switching device down during a failure mode within the desired 10 μsec time limit. The drive circuitry also has the added feature of reducing the power internal to the switching device before the driver is shut down. This eliminates the problem of destroying the device in the process of trying to save it during shut down. Supply and gate drive voltage monitoring is also incorporated in this circuit design to prevent switch device failure caused by overheating. These capabilities increase the mean time between failure of the switching device and thus increases the reliability of motor systems employing the fault protection gate drive circuit design of the current invention.

What has thus been described is a fault protection circuit for a power switching device. The fault protection circuit prevents damage to a MOS switching device by providing a comparator and logic circuitry which disables the driver circuit when an excess voltage is detected. The fault protection circuit shuts down the MOS switching device without allowing transient currents to damage the device by providing a field effect transistor which acts to drain the gate of the MOS switching device during shut down. The fault protection circuit also has undervoltage comparators to prevent the switching device from failing because of undersaturated operation.

Obviously many modifications and variations of the present invention may become apparent in light of the above teachings. For example: as disclosed above the latch can be connected to the control circuitry in order that the control circuitry can take corrective action to prevent the failure; the saturation comparator can be positioned between two resistors providing a voltage divider effect to measure the voltage across the switching device when the switching device gate is open; and the saturation comparator can be positioned with a high speed diode between the comparator and the switching device to measure the switching device saturation voltage when the gate of the switching device is closed.

In light of the above, it is therefore understood that within the scope of the appended claims, the invention may be practiced otherwise than as specifically described.

What is claimed is:

1. A fault protection circuit interposed between a controller and a power switching device comprising:

a driver circuit powered by a gate driver high voltage and a gate driver low voltage and having inputs electrically connected to said controller, an output electrically connected to the gate of said switching device, and a disabling means for shutting down said driver on receipt of an electrical fault signal, said driver circuit providing an asserted switch signal to turn on said switching device and a deasserted switch signal to turn off said switching device;

a saturation comparator having a first comparator input electrically connected between the collector of said power switching device and a ground voltage, a second comparator input electrically connected to a reference voltage source, and a comparator output providing an electrical fault signal if said first comparator input registers a higher voltage than said second comparator input, said saturation comparator being provided to determine if said switching device is switching an excessive voltage;

a switching means responsive to said saturation comparator output, said switching means electrically connected between said gate of said power switching device and said ground voltage, said switching means being provided to reduce current to said gate of said power switching device when said saturation comparator output indicates that said switching device is switching an excessive voltage;

a time delay means responsive to said driver circuit output to delay the propagation of said asserted switch signal from said driver circuit output, said time delay means transmitting said deasserted switch signal without delay to said output to avoid false fault signals when said driver circuit signals said switching device to switch on and to prevent damage to said switching device when said driver circuit signals said switching device to switch off; and a shut down logic circuit responsive to said saturation comparator output and to said time delay circuit output to provide a sustained electrical fault signal to disable said driver circuit when said time delay means output indicates said asserted switch signal and said saturation comparator output indicates said electrical fault signal.

2. The fault protection circuit of claim 1 further comprising:

a positive undervoltage comparator having a first input electrically connected to said gate driver high voltage, a second input electrically connected to a high reference voltage, and an output providing an electrical fault signal if said gate driver high voltage is a preselected amount below said high reference voltage;

a negative undervoltage comparator having a first input electrically connected to the gate driver low voltage, a second input electrically connected to a low reference voltage, and an output providing an electrical fault signal if said gate driver low voltage is a preselected amount above said low reference voltage; and said shut down logic circuit being responsive to said negative undervoltage comparator output and to said positive undervoltage comparator output to provide a sustained electrical fault signal to disable said driver circuit when said shut down logic circuit receives said electrical fault signal.

3. The fault protection circuit of claim 2 further comprising a current limiting means electrically disposed among said saturation comparator first input, a collector of said switching device, and said ground voltage.

4. The fault protection circuit of claim 3 wherein said current limiting means comprises:

a first resistor interposed between said saturation comparator first input and the collector of said switching device; and a second resistor interposed between said saturation comparator first input and said ground voltage for dividing the voltage provided to said saturation comparator first input.

5. The fault protection circuit of claim 4 further comprising:

said switching means being a field effect transistor having a gate electrically connected to said saturation comparator output, a drain electrically connected to said gate of said power switching device, and a source electrically connected to said ground voltage; and a buffer having an input electrically connected to said saturation comparator output and an output electrically connected to said gate of said field effect transistor, said buffer being provided to reduce time delays to said saturation comparator electrical fault output signal caused by the inherent capacitance of said field effect transistor gate.

6. The fault protection circuit of claim 5 wherein said shut down logic circuit comprises:

an AND gate means having a first input electrically connected to said output of said saturation comparator, a second input electrically connected to said output of said time delay circuit, and an output, said AND gate means providing an electrical fault signal if said saturation comparator output is an electrical fault signal and said time delay output is an asserted switch signal;

a three way OR gate means having a first input electrically connected to said AND gate means output, a second input electrically connected to said positive undervoltage comparator output, a third input electrically connected to said negative undervoltage comparator output, and an output providing an electrical fault signal if any of said OR gate means inputs receives an electrical fault signal; and a latch having an input electrically connected to said OR gate means and an output electrically connected to said disabling means of said driver circuit to provide a sustained electrical fault signal to disable said driver circuit when said input receives an electrical fault signal, said output being further connected to said controller to transmit said electrical fault signal to said controller, and said input being further connected to said controller to allow said controller to reset said latch and thereby enable said driver circuit.

7. The fault protection circuit of claim 3 wherein said current limiting means comprises:
- a diode having an ultra-fast reverse recovery speed interposed between said saturation comparator first input and the collector of said switching device and being biased against current flow from said switching device collector to said saturation comparator first input, said diode blocking current flow to said comparator when said switching device gate is open; and
- a resistor interposed between said saturation comparator first input and said ground voltage to reduce the current flow between said ground and said saturation comparator first input.

8. The fault protection circuit of claim 7 further comprising:
- said switching means being a field effect transistor having a gate electrically connected to said saturation comparator output, a drain electrically connected to said gate of said power switching device, and a source electrically connected to said ground voltage; and
- a buffer having an input electrically connected to said saturation comparator output and an output electrically connected to said gate of said field effect transistor, said buffer being provided to reduce time delays to said saturation comparator electrical fault output signal caused by the inherent capacitance of said field effect transistor gate.

9. The fault protection circuit of claim 8 wherein said shut down logic circuit comprises:
- an AND gate means having a first input electrically connected to said output of said saturation comparator, a second input electrically connected to said output of said time delay circuit, and an output, said AND gate means providing an electrical fault signal if said saturation comparator output is an electrical fault signal and said time delay output is an asserted switch signal;
- a three way OR gate means having a first input electrically connected to said AND gate means output, a second input electrically connected to said positive undervoltage comparator output, a third input electrically connected to said negative undervoltage comparator output, and an output providing an electrical fault signal if any of said OR gate means inputs receives an electrical fault signal; and
- a latch having an input electrically connected to said OR gate means and an output electrically connected to said disabling means of said driver circuit to provide a sustained electrical fault signal to disable said driver circuit when said input receives an electrical fault signal, said output being further connected to said controller to transmit said electrical fault signal to said controller, and said input being further connected to said controller to allow said controller to reset said latch and thereby enable said driver circuit.

10. A fault protection power switching device joined to a controller comprising:
- a driver circuit powered by a gate driver high voltage and a gate driver low voltage and having inputs electrically connected to said controller, an output, and a disabling means for shutting down said driver on receipt of an electrical fault signal, said driver circuit output providing an asserted switch signal and a deasserted switch signal;
- a switching device having a gate electrically connected to said driver circuit output, a collector electrically connected to a power source, and an emitter electrically connected to a load for closing on receipt of the asserted switch signal and opening on receipt of the deasserted switch signal from said driver circuit output;
- a saturation comparator having a first comparator input electrically connected between the collector of said power switching device and a ground voltage, a second comparator input electrically connected to a reference voltage source, and a comparator output providing an electrical fault signal if said first comparator input registers a higher voltage than said second comparator input, said saturation comparator being provided to determine if said switching device is switching an excessive voltage;
- a switching means responsive to said saturation comparator output, said switching means electrically connected between said gate of said power switching device and said ground voltage, said switching means being provided to reduce current to said gate of said power switching device when said saturation comparator output indicates that said switching device is switching an excessive voltage;
- a time delay means responsive to said driver circuit output to delay the propagation of said asserted switch signal from said driver circuit output, said time delay means transmitting said deasserted switch signal without delay to said output to avoid false fault signals when said driver circuit signals said switching device to switch on and to prevent damage to said switching device when said driver circuit signals said switching device to switch off;
- a positive undervoltage comparator having a first input electrically connected to said gate driver high voltage, a second input electrically connected to a high reference voltage, and an output providing an electrical fault signal if said gate driver high voltage is a preselected amount below said high reference voltage;
- a negative undervoltage comparator having a first input electrically connected to the gate driver low voltage, a second input electrically connected to a low reference voltage, and an output providing an electrical fault signal if said gate driver low voltage is a preselected amount above said low reference voltage; and
- a shut down logic circuit responsive to said saturation comparator output, said negative undervoltage comparator output, and said positive undervoltage comparator output and to said time delay circuit output to provide a sustained electrical fault signal to disable said driver circuit when said time delay means output indicates said asserted switch signal and said shut down logic circuit receives said electrical fault signal.

11. The fault protection power switching device of claim 10 further comprising a current limiting means electrically disposed among said saturation comparator first input, a collector of said switching device, and said ground voltage.

12. The fault protection power switching device of claim 11 wherein said current limiting means comprises:
- a first resistor interposed between said saturation comparator first input and the collector of said switching device; and a second resistor interposed between said saturation comparator first input and said ground voltage for dividing the voltage provided to said saturation comparator first input.

13. The fault protection power switching device of claim 12 further comprising:

said switching means being a field effect transistor having a gate electrically connected to said saturation comparator output, a drain electrically connected to said gate of said power switching device, and a source electrically connected to said ground voltage; and a buffer having an input electrically connected to said saturation comparator output and an output electrically connected to said gate of said field effect transistor, said buffer being provided to reduce time delays to said saturation comparator electrical fault output signal caused by the inherent capacitance of said field effect transistor gate.

14. The fault protection power switching device of claim 13 wherein said switching device is a metal oxide semiconductor device.

15. The fault protection power switching device of claim 14 wherein said metal oxide semiconductor device is an insulated gate bipolar transistor.

16. The fault protection power switching device of claim 11 wherein said current limiting means comprises:

a diode having an ultra-fast reverse recovery speed interposed between said saturation comparator first input and the collector of said switching device and being biased against current flow from said switching device collector to said saturation comparator first input, said diode blocking current flow to said comparator when said switching device gate is open; and a resistor interposed between said saturation comparator first input and said ground voltage to reduce the current flow between said ground and said saturation comparator first input.

17. The fault protection power switching device of claim 16 further comprising:

said switching means being a field effect transistor having a gate electrically connected to said saturation comparator output, a drain electrically connected to said gate of said power switching device, and a source electrically connected to said ground voltage; and a buffer having an input electrically connected to said saturation comparator output and an output electrically connected to said gate of said field effect transistor, said buffer being provided to reduce time delays to said saturation comparator electrical fault output signal caused by the inherent capacitance of said field effect transistor gate.

18. The fault protection power switching device of claim 17 wherein said switching device is a metal oxide semiconductor device.

19. The fault protection power switching device of claim 18 wherein said metal oxide semiconductor device is an insulated gate bipolar transistor.

* * * * *